(12) United States Patent
Choi et al.

(10) Patent No.: US 12,340,853 B2
(45) Date of Patent: Jun. 24, 2025

(54) SEMICONDUCTOR DEVICE PERFORMING PROGRAM OPERATION AND OPERATING METHOD THEREOF

(71) Applicant: SK hynix Inc., Icheon-si Gyeonggi-do (KR)

(72) Inventors: Hyung Jin Choi, Icheon-si Gyeonggi-do (KR); Se Chun Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 151 days.

(21) Appl. No.: 18/310,760

(22) Filed: May 2, 2023

(65) Prior Publication Data

US 2024/0177784 A1  May 30, 2024

(30) Foreign Application Priority Data

Nov. 24, 2022  (KR) .......................... 10-2022-0159034

(51) Int. Cl.
| | | |
|---|---|---|
| *G11C 16/04* | (2006.01) | |
| *G11C 16/08* | (2006.01) | |
| *G11C 16/10* | (2006.01) | |
| *G11C 16/34* | (2006.01) | |

(52) U.S. Cl.
CPC .......... *G11C 16/3459* (2013.01); *G11C 16/08* (2013.01); *G11C 16/102* (2013.01)

(58) Field of Classification Search
CPC .................................................. G11C 16/0483
See application file for complete search history.

(56) References Cited

U.S. PATENT DOCUMENTS

2021/0158871 A1\*  5/2021  Shin ................... G11C 16/0483

FOREIGN PATENT DOCUMENTS

| | | |
|---|---|---|
| KR | 1020190073943 A | 6/2019 |
| KR | 1020200126609 A | 11/2020 |
| KR | 1020210105728 A | 8/2021 |

\* cited by examiner

*Primary Examiner* — Jason Lappas
(74) *Attorney, Agent, or Firm* — WILLIAM PARK & ASSOCIATES LTD.

(57) ABSTRACT

A method of operating a semiconductor device includes: starting a program operation on selected memory cells among a plurality of memory cells in response to a program command; suspending the program operation in response to a program suspend command; and performing a pre-verify operation by using a modified verify voltage in response to a program resume command.

22 Claims, 18 Drawing Sheets

SEMICONDUCTOR DEVICE PERFORMING PROGRAM OPERATION AND OPERATING METHOD THEREOF

CROSS-REFERENCE TO RELATED APPLICATION

The present application claims priority under 35 U.S.C. § 119(a) to Korean patent application number 10-2022-0159034 filed on Nov. 24, 2022, in the Korean Intellectual Property Office, the entire disclosure of which is incorporated by reference herein.

BACKGROUND

1. Technical Field

The present disclosure generally relates to an electronic device, and more particularly, to a semiconductor device performing a program operation and an operating method thereof.

2. Related Art

A semiconductor memory device may be formed in a two-dimensional structure in which strings of memory transistors are arranged horizontally on a semiconductor substrate. A semiconductor memory device may also be formed to have a three-dimensional structure in which memory transistor strings are arranged horizontally and vertically, relative to a semiconductor substrate. A three-dimensional memory provides an integration that can be much greater than that of two-dimensional semiconductor memory devices partly because a three-dimensional memory device includes memory cells vertically stacked above a semiconductor substrate.

SUMMARY

Embodiments provide a semiconductor device capable of narrowing a threshold voltage distribution of memory cells in a program operation, and an operating method of the semiconductor device.

In accordance with an aspect of the present disclosure, there is provided a method of operating a semiconductor device, the method including: starting a program operation on selected memory cells among a plurality of memory cells in response to a program command; suspending the program operation in response to a program suspend command; and performing a pre-verify operation by using a modified verify voltage in response to a program resume command.

The program may include a plurality of program loops. Each program loop may include a memory program phase and a memory verify phase. The verify phase may include applying to a word line connected to the selected memory cells, a main verify voltage and an auxiliary verify voltage, the magnitude of which is less than the main verify voltage magnitude.

In accordance with another aspect of the present disclosure, there is provided a semiconductor device including: a memory block including a plurality of memory cells; and a peripheral circuit configured to perform a program operation including a plurality of program loops on selected memory cells among a plurality of memory cells included in the memory block. The peripheral circuit comprises control logic configured to control the program operation of the peripheral circuit, control the peripheral circuit to suspend the program operation in response to a program suspend command, and control the peripheral circuit to perform a pre-verify operation on the selected memory cells, based a modified verify voltage, in response to a program resume command.

Each of the plurality of program loops may include a program phase and a verify phase. In the verify phase, the control logic may control the peripheral circuit to perform a verify operation using a main verify voltage and an auxiliary verify voltage less than the main verify voltage. In the pre-verify operation, the control logic may control the peripheral circuit to perform a verify operation using the main verify voltage and a decreased auxiliary verify voltage.

In accordance with still another aspect of the present disclosure, there is provided a semiconductor device including: a memory block including a plurality of memory cells for storing N-bit data per memory cell; and a peripheral circuit configured to perform a program operation including a plurality of program loops on selected memory cells among the plurality of memory cells included in the memory block. The peripheral circuit comprises control logic configured to control the program operation of the peripheral circuit in response to a program command, control the peripheral circuit to suspend the program operation in response to a program suspend command received after verification of memory cells to be programmed to an ith program state among first to $(2^N-1)$th program states passes, and control the peripheral circuit to perform a pre-verify operation on memory cells to be programmed to a jth program state among (i+1)th to $(2^N-1)$th program states, based on a modified verify voltage, in response to a program resume command, wherein N is a natural number greater than 1, i is a natural number which is greater than 0 and is smaller than $(2^N-1)$, and j is a natural number which is greater than i and is smaller than $2^N$.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
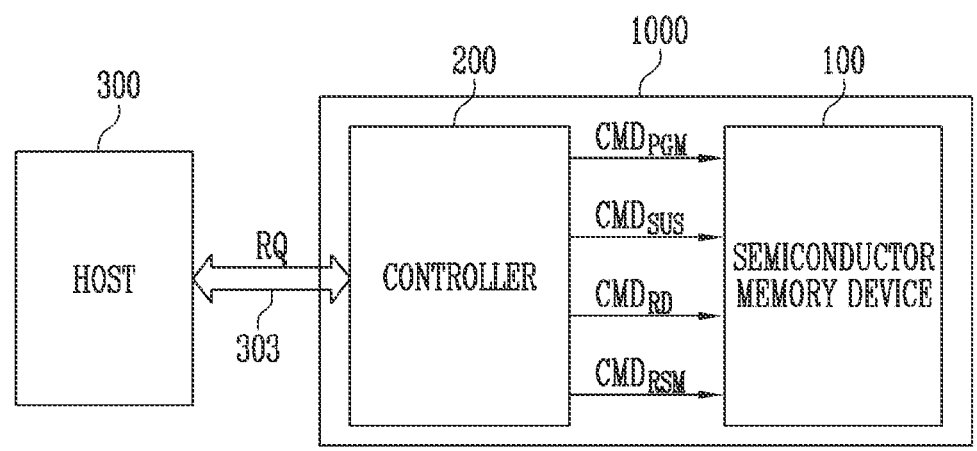
FIG. 1 is a block diagram illustrating a storage device including a semiconductor memory device in accordance with an embodiment of the present disclosure.

FIG. 1 is a block diagram illustrating a storage device 1000. The storage device 1000 may include a semiconductor memory device 100 and a controller 200. The storage device 1000 may communicate with a host device 300 via a bus 303 that extends between the host device 300 and the controller 200. The controller 200 may control the semiconductor memory device 100. The controller 200 may also control operation of the semiconductor memory device 100, based on an operation request by the controller 200 received from the host device 300.

The controller 200 may exchange data or "communicate" with the host device 300 via the bus 303 in response to or "based on" requests RQ that the controller 200 receives from the host device 300. For instance, the controller 200 may receive from the host device 300, a write request, a read request, a trim request, or the like, and control the semiconductor memory device 100, as needed by the nature of a received request. When the controller 200 receives a particular command from the host device 300, the controller 200 may generate and send commands to the memory device, which will control or operate the semiconductor memory device 100, as might be required by the command that the controller 200 received from the host device 300. The controller 200 may also exchange data DATA with the semiconductor memory device 100, i.e., the controller can send data to or receive data from the semiconductor memory device 100.

The semiconductor memory device 100 may receive a command and an address from the controller 200, and access an area selected by an address in the memory cell array. That is, the semiconductor memory device 100 itself, may perform an internal operation corresponding to the command for an area selected by an address received from the controller 200.

For example, the semiconductor memory device 100 may perform a program operation, a read operation, and an erase operation. In the program operation, the semiconductor memory device 100 may program data into one or more storage locations in an area selected by an address that the semiconductor memory device 100 received from the controller 200. In the read operation, the semiconductor memory device 100 may read data from the area selected by the address. In the erase operation, the semiconductor memory device 100 may erase data stored in the area selected by the address.

The storage device 1000 in accordance with the embodiment of the present disclosure may provide a program suspend function and a program resume function, both of which may be associated with program, read or erase operations of the semiconductor memory device 100. For example, while the semiconductor memory device 100 performs the program operation as a detailed operation of a garbage collection operation, a read request may be transferred from the host device 300 to the storage device 1000. The controller 200 may control the semiconductor memory device 100 to suspend the program operation being performed and to perform instead a read operation corresponding to the read request received from the host device 300. For example, if the controller 200 receives a read request from the host device 300 while a program operation is underway, the controller 200 may send a program suspend command to the semiconductor memory device 100 in response to the read request received by the controller 200. The semiconductor memory device 100 may then autonomously suspend the program operation being performed in response to the program suspend command received from the controller 200. After that, the controller 200 may send, to the semiconductor memory device 100, a read command corresponding to the read request received from the host device 300. The semiconductor memory device 100 may then perform a read operation corresponding to the read command that the semiconductor device 100 received from the controller 200. After read data is transferred from the semiconductor memory device 100 to the controller 200, the controller 200 may then send (also known as issuing or outputting or transmitting) a program resume command to the semiconductor memory device 100. The semiconductor memory device 100 may then resume the program operation which was suspended in response to the program resume command the controller 200 sent to the semiconductor memory device 100.

Still referring to FIG. 1, the controller 200 may send or transmit a program command $CMD_{PGM}$ to the semiconductor memory device 100. The semiconductor memory device 100 may then perform a program operation on selected memory cells according to the program command $CMD_{PGM}$ received from the controller 200. Before the program operation of the semiconductor memory device 100 is completed, however, the controller 200 may require specific data from the semiconductor memory device 100.

Figure 2:
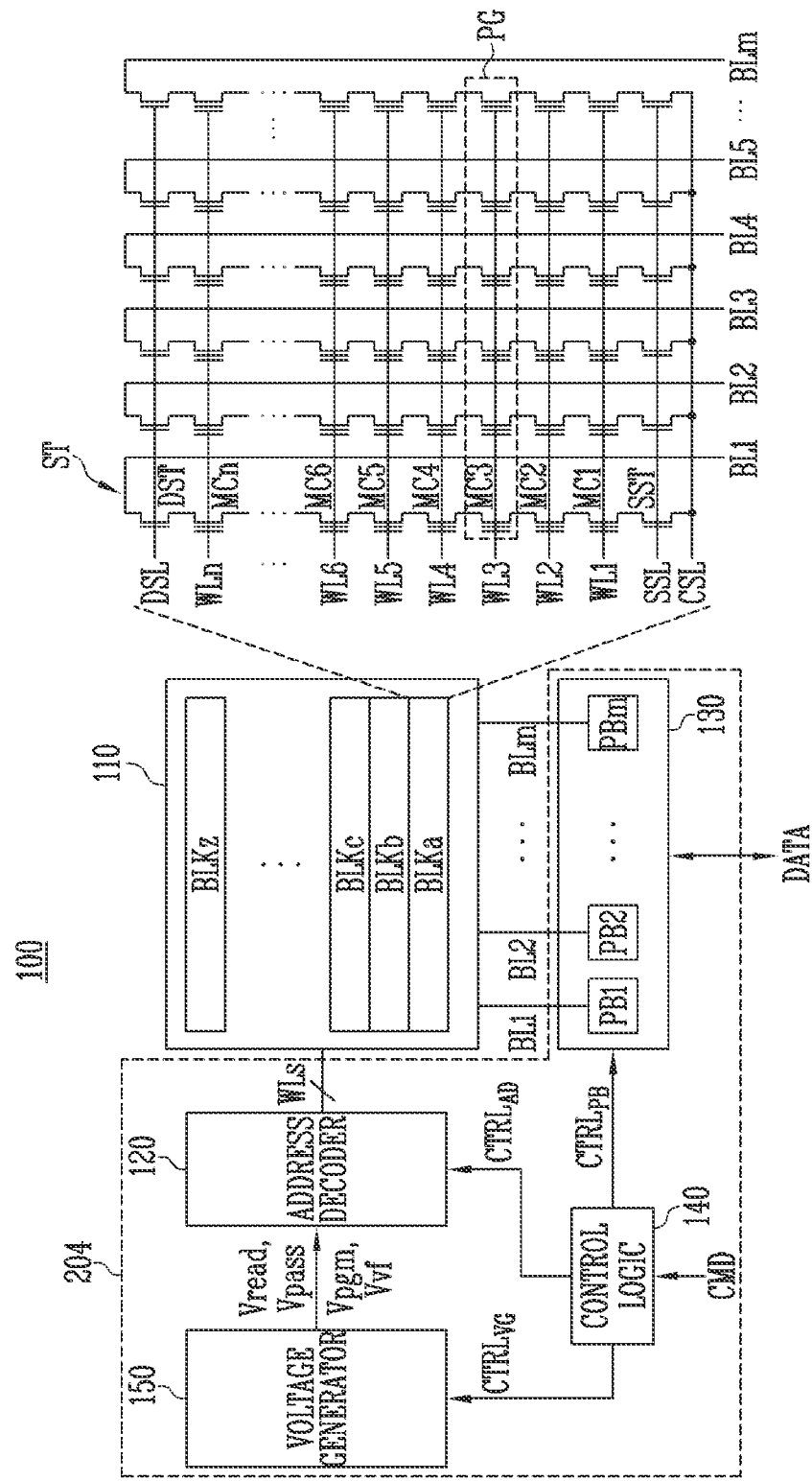
FIG. 2 is a block diagram illustrating a semiconductor memory device in accordance with an embodiment of the present disclosure.

The controller 200 may send a program suspend command $CMD_{SUS}$ to the semiconductor memory device 100. The semiconductor memory device 100 may suspend the program operation being performed in response to the received program suspend command $CMD_{SUS}$. In a state in which the semiconductor memory device 100 suspends the program operation, the controller 200 may send a read command $CMD_{RD}$ to the semiconductor memory device 100. The semiconductor memory device 100 may read data corresponding to the received read command $CMD_{RD}$ and send the read data to the controller 200, in response to the read command $CMD_{RD}$. After the controller 200 receives the data corresponding to the read command $CMD_{RD}$, the controller 200 may send a program resume command $CMD_{RSM}$ to the semiconductor memory device 100. The semiconductor memory device 100 may resume the program operation which has been suspended in response to the program resume command $CMD_{RSM}$. FIG. 2 is a block diagram illustrating a semiconductor memory device 100 in accordance with an embodiment of the present disclosure. The semiconductor memory device 100 may include a memory cell array 110, an address decoder 120, a read/write circuit 130, control logic 140 comprising combinational and sequential logic devices or equivalent functionality provided by a processor, and a voltage generator 150.

The memory cell array 110 includes a plurality of memory blocks BLKa to BLKz. The plurality of memory blocks BLKa to BLKz are connected to the address decoder 120 through word lines WL1 to WLn. The plurality of memory blocks BLKa to BLKz are connected to the read/write circuit 130 through bit lines BL1 to BLm. Each of the plurality of memory blocks BLKa to BLKz includes a plurality of memory cells. In an embodiment, the plurality of memory cells may be nonvolatile memory cells, and be configured as nonvolatile memory cells having a vertical channel structure.

FIG. 2 illustrates the structure of a memory block BLKa exemplar selected from plurality of memory blocks BLKa to BLKz included in the memory cell array 110 illustrated in FIG. 2. A plurality of word lines WL1 to WLn arranged in parallel to each other may be connected between a drain select line DSL and a source select line SSL. More specifically, the memory block BLKa may include a plurality of serially-connected memory cell transistors, which comprise the strings ST which are connected between the bit lines BL1 to BLm and a common source line CSL. The bit lines BL1 to BLm may be respectively connected to corresponding memory cell transistor strings ST, which in the interest of brevity are referred to hereinafter as strings ST The common source line CSL may be commonly connected to the strings ST. The strings ST may be configured identically to one another, and therefore, a string ST connected to a first bit line BL1 will be described in detail as an example.

As FIG. 2 shows, a string ST may include a source select transistor SST, a plurality of memory cells MC1 to MCn, and a drain select transistor DST, which are connected in series to each other between the common source line CSL and the first bit line BL1. At least one source select transistor SST and at least one drain select transistor DST may be included in one string ST.

The source node of the source select transistor SST may be connected to the common source line CSL. The drain node of the drain select transistor DST may be connected to the first bit line BL1. The memory cells MC1 to MCn may be connected in series between the source select transistor SST and the drain select transistor DST. Gates of source select transistors SST included in different strings ST may be connected to the source select line SSL, gates of drain select transistors DST of the different strings ST may be connected to the drain select line DSL, and gates of memory cells MC1 to MCn of the different strings ST may be connected to the plurality of word lines WL1 to WLn. A group of memory cells connected to the same word line among the memory cells included in the different strings ST may be referred to as a physical page PG. Therefore, physical pages PG of which number corresponds to the number of the word lines WL1 to WLn may be included in the memory block BLKa.

One memory cell may store one bit of data, i.e., a logic zero or a logic one. Such a memory cell is generally referred to as a single level cell (SLC). One physical page PG may store one logical page (LPG) of data. One LPG of data may include data bits, a number of which corresponds to the number of cells included in one physical page PG.

Meanwhile, one memory cell may store two-or-more-bit data. One physical page PG may store two or more LPGs of data.

Although the structure of a two-dimensional memory block is illustrated in FIG. 2, the present disclosure is not limited thereto. That is, each of the memory blocks BLKa to BLKz shown in FIG. 2 may be alternatively embodied or configured as a three-dimensional memory block.

The 2008 edition of the I.E.E.E. Standard's Dictionary defines a "peripheral" as a device, attached to a host via a communication link. In FIG. 2, the address decoder 120, the read/write circuit 130, the control logic 140 and the voltage generator 150 operate as, and are considered herein to be, a peripheral circuit 204 to the controller 200, which drives, i.e., controls, the memory cell array 110. The peripheral circuit 204 may perform various operations, including a read operation, a write operation, and an erase operation on the memory cell array 110, each of which is performed under the control of the control logic 140 portion of the peripheral circuit 204, which is coupled to and receives commands CMD from the controller 200. The address decoder 120 portion of the peripheral circuit is connected to the memory cell array 110 through word lines WLs. The address decoder 120 portion of the peripheral circuit 204 operates under the control of the control logic 140. Specifically, the control logic 140 transfers an address decoding control signal $CTRL_{AD}$ to the address decoder 120, and the address decoder 120 performs a decoding operation, based on the address decoding control signal $CTRL_{AD}$.

During a program operation, the address decoder 120 may apply a program voltage Vpgm generated in the voltage generator 150 to a selected word line, and apply a program pass voltage, Vpass, to the other unselected word lines. Also, in a program verify operation, the address decoder 120 may apply a verify voltage Vvf generated in the voltage generator 150 to the selected word line, and apply a verify pass voltage to the other unselected word lines.

The read/write circuit 130 includes a plurality of page buffers PB1 to PBm. The read/write circuit 130 may operate as a "read circuit" in a read operation, and may operate as a "write circuit" in a write operation. The plurality of page buffers PB1 to PBm are connected to the memory cell array 110 through the bit lines BL1 to BLm. The read/write circuit 130 performs a read operation on received data DATA in response to a page buffer control signal $CTRL_{PB}$ output from the control logic 140.

The control logic 140, which is comprised of combinational and sequential logic circuits or a functionally-equivalent processor, all of which are omitted from FIG. 2 in the interest of brevity, is connected to the address decoder 120, the read/write circuit 130, and the voltage generator 150. The control logic 140 may receive a command CMD from the outside. The control logic 140 may control the address decoder 120, the read/write circuit 130, and the voltage generator 150 to perform an operation corresponding to the received command CMD. That is, the control logic 140 may control an operation of the voltage generator 150 through a voltage generation control signal $CTRL_{VG}$. Also, the control logic 140 may control an operation of the address decoder 120 through the address decoding control signal $CTRL_{AD}$. Meanwhile, the control logic 140 may control operations of the page buffers PB1 to PBm in the read/write circuit 130 through the page buffer control signal $CTRL_{PB}$.

In a read operation, the voltage generator 150 generates the read voltage Vread and the pass voltage Vpass in response to the voltage generation control signal $CTRL_{VG}$ output from the control logic 140. The voltage generator 150 may generate various different-magnitude operating voltages. For example, the voltage generator 150 may generate the program voltage Vpgm used for the program operation and the verify voltage Vvf used for the program verify operation. Also, the voltage generator 150 may generate the program pass voltage and the verify pass voltage.

The program operation may be performed in units of pages. Memory cells commonly connected to one word line may constitute a physical page. In an embodiment, the physical page may include at least one logical page. Therefore, page data as data stored in the physical page may include at least one logical page data. For example, when a memory cell is programmed in an SLC mode, the physical page may include one logical page, and the page data may include one logical page data. Alternatively, when a memory cell is programmed in an MLC mode, the physical page may include two logical pages, and the page data may include two logical pages of data. The two logical pages of data may be Least significant bit (LSB) page data and Most Significant Bit (MSB) page data. Alternatively, when a memory cell is programmed in a TLC mode, the physical page may include three logical pages, and the page data may include three logical page data. The three logical page data may be Least significant Bit (LSB) page data, Central Significant Bit (CSB) page data, and Most Significant Bit (MSB) page data.

The program operation may include a plurality of program loops. For example, the program operation may be started by running or performing a first program loop $1^{st}$ PGM Loop. If the program operation is not completed, even though the first program loop $1^{st}$ PGM Loop has been performed, a second program loop $2^{nd}$ PGM Loop may be performed. When the program operation is not completed even though the first program loop and the second program loop $2^{nd}$ PGM Loop have been completed, a third program loop $3^{rd}$ PGM Loop may also be performed. In this manner, program loops may be repeatedly run or performed, until the program operation is completed. When the program operation is not completed even though program loops have been repeatedly performed up to a predetermined maximum program loop number, it may be determined that the program operation fails.

Each program loop may include a program phase PGM and a verify phase. In the program phase, a program voltage may be applied to a selected word line, so that a threshold voltage of memory cells in a program allow state increases. In the verify phase, it may be verified whether memory cells selected as a program target have been programmed to a verify voltage or greater, which has a predetermined, desired level. As a result of a verify operation, a memory cell which is not programmed to the verify voltage or greater may be operated as a program allow cell in a subsequent program loop. A program voltage having a high voltage level, i.e., magnitude, may be applied to program allow cells, as compared with a previous program loop. Meanwhile, a memory cell which is programmed to the verify voltage or greater may be operated as a program inhibit cell in a subsequent program loop. Although a program voltage is applied to the selected word line, a threshold voltage of the program inhibit cell may not increase.

Figure 3:
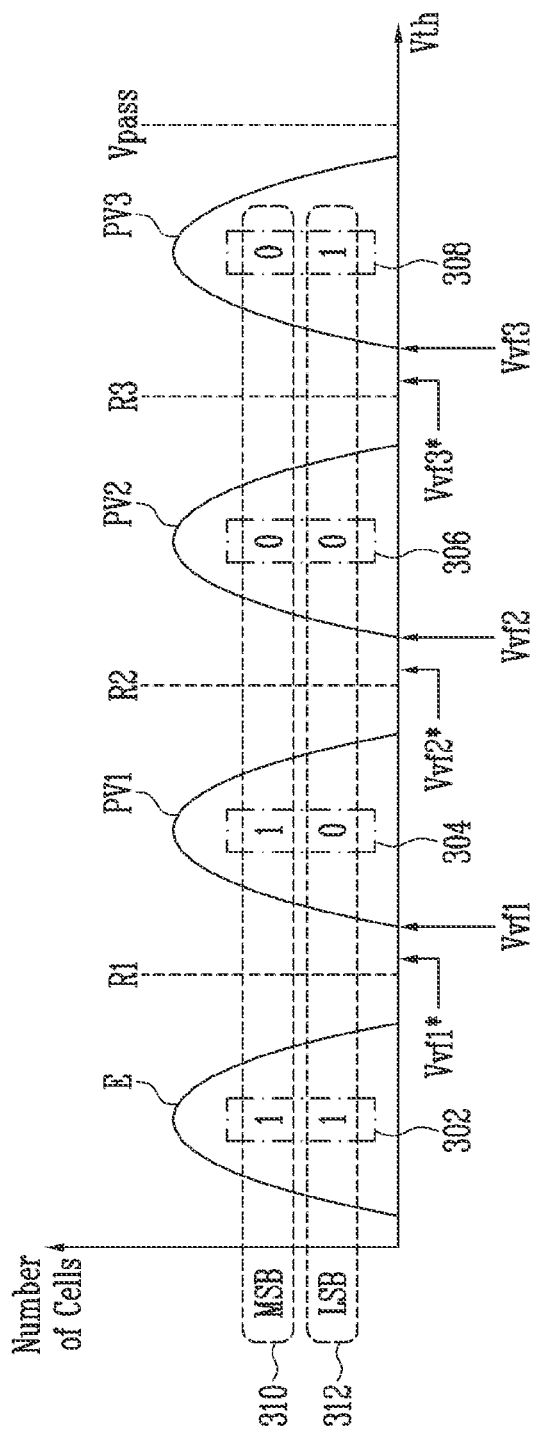
FIG. 3 is a diagram illustrating a threshold voltage distribution of multi-level cells (MLCs), and a main verify voltage and an auxiliary verify voltage, which are used to form the same.

FIG. 3 is a diagram illustrating a threshold voltage distribution of multi-level cells (MLCs), a main verify voltage and an auxiliary verify voltage, which are used in verify operation. In FIG. 3, the horizontal axis is labelled Vth to depict the relative magnitudes (values) of threshold voltages, Vth. The vertical axis is labelled "Number of Cells."

In FIG. 3, a first data pattern comprising four, Most Significant Bits or MSBs "1100" are enclosed within a first rectangle 310. Four, Least Significant Bits or LSBs, "1001" are enclosed within a second rectangle 312. MSBs and LSBs, are stored in a multi-level cell MLC, and a distribution of threshold voltages, Vth, corresponding thereto are illustrated. The MLC stores two-bit data including a Most Significant Bit (MSB) and a Least Significant Bit (LSB).

In the example shown in FIG. 3, a memory cell in an erase state, E, may store an MSB/LSB data pattern 302 of "11." Memory cells in a first program state PV1 may store an MSB/LSB data pattern 304 of "10." A memory cell in a second program state PV2 may store an MSB/LSB data pattern 306 of "00." A memory cell in a third program state PV3 may store an MSB/LSB data pattern 306 of "01." Meanwhile, the pass voltage Vpass may be applied to an unselected word line.

Still referring to FIG. 3, main verify voltages Vvf1, Vvf2 and Vvf3, and auxiliary verify voltages Vvf1*, Vvf2* and Vvf3* may be used. The auxiliary verify voltages Vvf1*, Vvf2*, and Vvf3* may be used to distinguish memory cells each having a threshold voltage near and less than the main verify voltages Vvf1, Vvf2, and Vvf3. A threshold voltage change for memory cells near or approximating the main verify voltages Vvf1, Vvf2, and Vvf3 is decreased, so that the threshold voltage distribution width of each of the E, PV1, PV2, and PV3 can be narrowed.

More specifically, a first program-allow voltage is applied to a bit line connected to memory cells having a threshold voltage, Vth less than a first auxiliary verify voltage Vvf1* among memory cells to be programmed to the first program state PV1. In an embodiment, the first program-allow voltage may be a ground or other reference voltage. Meanwhile, a second program-allow voltage is applied to a bit line connected to memory cells having a threshold voltage which is greater than the first auxiliary verify voltage Vvf1* and is less than a first main verify voltage Vvf1 among the memory cells to be programmed to the first program state PV1. In an embodiment, the second program allow voltage may be a voltage greater than the first program allow voltage. In addition, a program inhibit voltage is applied to a bit line connected to memory cells having a threshold voltage greater than the main verify voltage Vvf1 among the memory cells to be programmed to the first program state PV1. The program inhibit voltage is a voltage greater than the second program allow voltage. In an embodiment, the program inhibit voltage may be a power voltage.

While a program voltage is applied to a selected word line, the threshold voltage of the memory cells connected to the bit line to which the program inhibit voltage is applied is maintained. Meanwhile, while the program voltage is applied to the selected word line, a threshold voltage movement width of the memory cells connected to the bit line to which the second program allow voltage is applied is smaller than a threshold voltage movement width of the memory cells connected to the bit line to which the first program allow voltage is applied. Accordingly, the threshold voltage change for memory cells near or approximating the first main verify voltage Vvf1 is decreased, so that the threshold voltage distribution of the memory cells programmed to the first program state PV1 can be narrowed.

In the above, the first program state PV1 has been described as an example. However, a program operation on the second and third program states PV2 and PV3 may be performed in the same manner.

Hereinafter, for convenience of description, a semiconductor memory device and an operation thereof in accordance with the present disclosure will be described based on a program operation on a MLC. However, the present disclosure is not limited thereto, and the semiconductor memory device and the operation thereof may be applied to program operations of a single-level cell (SLC), a triple-level cell (TLC), and the like.

The program operation of the semiconductor memory device may include a plurality of program loops. In each program loop, the program operation of the semiconductor memory device may be performed using an Incremental Step Pulse Programming (ISPP) method. The ISPP method is a method of programming memory cells while gradually increasing a program voltage. Whenever a number of times a program loop is performed is repeated, a program voltage applied in each program loop may gradually increase. In an embodiment, each of the plurality of program loops may include a program pulse apply phase and a program verify phase. In the program pulse apply step, a program voltage may be applied to a selected word line, thereby increasing a threshold voltage of program allow cell.

In the program verify phase, it may be verified whether memory cells selected as a program target have been programmed to a voltage having a desired level (hereinafter, referred to as a 'reference voltage') or greater. As a result of a verify operation, a memory cell which is not programmed to the reference voltage or greater may be operated as a program allow cell in a next program loop. A program pulse having a higher voltage level as compared with a previous program loop may be applied to program allow cells. Meanwhile, a memory cell programmed to the reference voltage or greater may be operated as a program inhibit cell in a next program loop. Although a program pulse is applied to the selected word line, a threshold voltage of the program inhibit cell may not increase.

As described above, the main verify voltage Vvf1, Vvf2, and Vvf3 and the auxiliary verify voltage Vvf1*, Vvf2*, and Vvf3* may be used in the program verify phase. The auxiliary verify voltages Vvf1*, Vvf2*, and Vvf3* may be voltages for distinguishing memory cells in the vicinity of, i.e., voltages that are nearly same or being substantially the same as a main verify voltage Vvf1, Vvf2, and Vvf3 corresponding to a target state. In the program verify phase, the first auxiliary verify voltage Vvf1*, the first main verify voltage Vvf1, a second auxiliary verify voltage Vvf2*, a second main verify voltage Vvf2, a third auxiliary verify voltage Vvf3*, and a third main verify voltage Vvf3 may be sequentially applied to the selected word line. However, this is merely illustrative, and only some of the first auxiliary verify voltage Vvf1*, the first main verify voltage Vvf1, the second auxiliary verify voltage Vvf2*, the second main verify voltage Vvf2, the third auxiliary verify voltage Vvf3*, and the third main verify voltage Vvf3 may be used in a program verify phase included in each program loop.

For example, any memory cells programmed to the second and third program states may not exist in an early stage of the program operation. Accordingly, in a first program loop $1^{st}$ PGM Loop, the verify operation may be performed using only the first auxiliary verify voltage Vvf1* and the first main verify voltage Vvf1. Meanwhile, as the program operation is performed, when threshold voltages of memory cells to be programmed to the first program state PV1 are all greater than the first verify voltage Vvf1, this is a state in which verification on the first program state PV1 passes. In a subsequent program loop, the first auxiliary verify voltage Vvf1* and the first main verify voltage Vvf1 may not be used.

Figure 4:
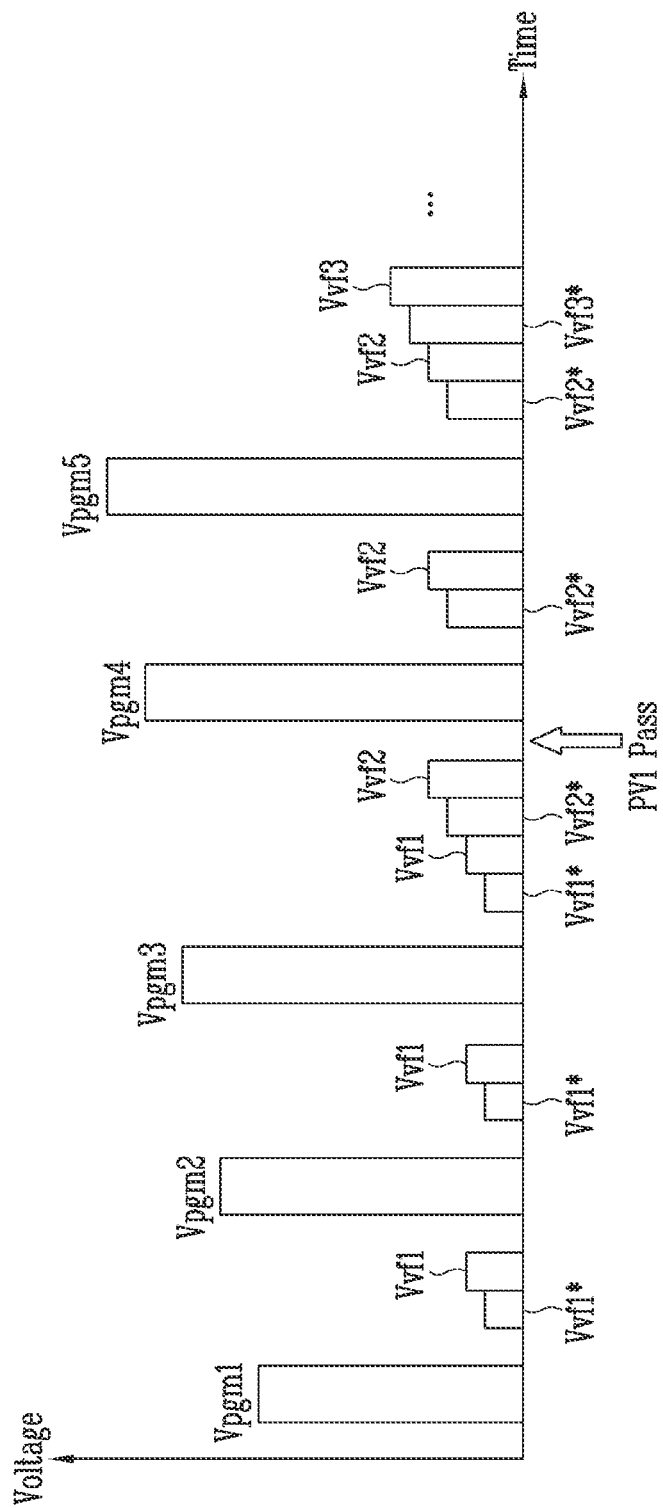
FIG. 4 is a diagram illustrating a voltage applied to a selected word line in a program operation.

FIG. 4 is a diagram illustrating a voltage applied to a selected word line in a program operation The program operation for forming the program states shown in FIG. 3 may include a plurality of program loops.

Referring to FIG. 4, in a program pulse-apply phase of a first program loop, a first program voltage, Vpgm1, may be applied to a selected word line. Also, in a verify phase of the first program loop, the first auxiliary verify voltage Vvf1* and the first main verify voltage Vvf1 may be applied to the selected word line. As described above, any memory cells programmed to the second and third program states may not exist in an early stage of the program operation. Accordingly, in the first program loop $1^{st}$ PGM Loop, the verify operation may be performed using only the first auxiliary verify voltage Vvf1* and the first main verify voltage Vvf1.

After that, in a program pulse-apply phase of a second program loop, a second program voltage Vpgm2 is applied to the selected word line. Also, in a verify phase of the second program loop, the first auxiliary verify voltage Vvf1* and the first main verify voltage Vvf1 may be applied to the selected word line.

After that, in a program pulse-apply phase of a third program loop, a third program voltage Vpgm3 is applied to the selected word line. Also, in a verify phase of the third program loop, the first auxiliary verify voltage Vvf1*, the first main verify voltage Vvf1, the second auxiliary verify voltage Vvf2*, and the second main verify voltage Vvf2 may be applied to the selected word line.

As shown in FIG. 4, verification of the first program state PV1 "passed" as a result obtained by performing a verify phase of a third program loop. Therefore, the first auxiliary verify voltage Vvf1* and the first main verify voltage Vvf1 may not be used in subsequent program loops. Accordingly, in a program pulse apply phase of a fourth program loop, a fourth program voltage Vpgm4 may be applied to the selected word line. Also, in a verify phase of the fourth program loop, the second auxiliary verify voltage Vvf2* and the second main verify voltage Vvf2 may be applied to the selected word line.

After that, in a program pulse-apply phase of a fifth program loop, a fifth program voltage Vpgm5 may be applied to the selected word line. Also, in a verify phase of the fifth program loop, the second auxiliary verify voltage Vvf2*, the second main verify voltage Vvf2, the third auxiliary verify voltage Vvf3*, and the third main verify voltage Vvf3 may be applied to the selected word line. In this manner, program loops may be repeatedly performed until verification on the second program state PV2 and the third program state PV3 passes.

In a verify phase of each program loop, at least one auxiliary verify voltage and at least one main verify voltage may be applied to the selected word line. In particular, as shown in FIG. 4, an embodiment is illustrated, in which at least one auxiliary verify voltage and at least one main verify voltage are applied to the selected word line in an order in which the verify voltages sequentially increase from a low voltage to a high voltage. However, this is merely illustrative, and the present disclosure is not limited thereto. For example, at least one auxiliary verify voltage and at least one main verify voltage may be applied to the selected word line in an order in which the verify voltages sequentially decrease from a high voltage to a low voltage.

Figure 5:
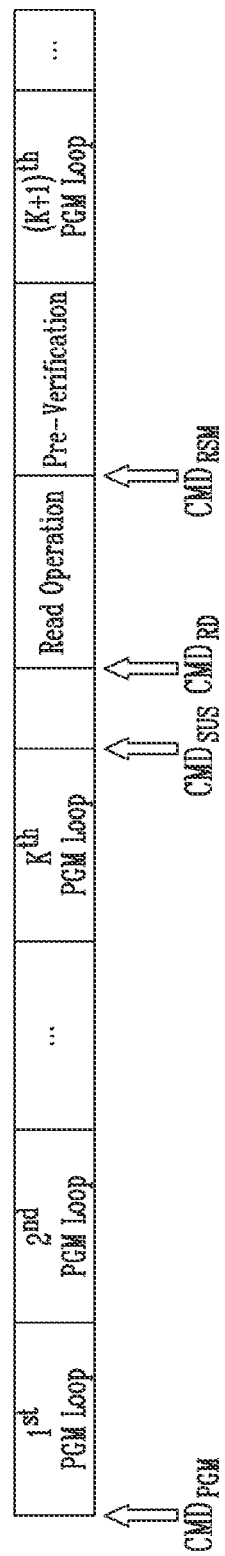
FIG. 5 is a diagram illustrating a method in which the semiconductor memory device is operated in response to commands shown in FIG. 1.

FIG. 5 is a diagram illustrating a method in which the semiconductor memory device is operated in response to commands shown in FIG. 1.

Referring to FIG. 5, the semiconductor memory device 100 starts a program operation in response to the program command $CMD_{PGM}$ from the controller 200. Specifically, the semiconductor memory device 100 may perform a plurality of program loops until verification of the first to third program states PV1 to PV3 passes.

Referring to FIG. 5, a situation is illustrated, in which the semiconductor memory device 100 receives the program suspend command $CMD_{SUS}$ from the controller 200 in a state in which the semiconductor memory device 100 performs a Kth program loop. The semiconductor memory device 100 may suspend the program operation in response to the program suspend command $CMD_{SUS}$. After that, the semiconductor memory device 100 may receive the read command $CMD_{RD}$ from the controller 200. After a read operation is completed, the semiconductor memory device 100 may receive the program resume command $CMD_{RSM}$ from the controller 200.

The semiconductor memory device 100 resumes the program operation in response to the program resume command $CMD_{RSM}$. More specifically, the semiconductor memory device 100 may perform a pre-verify operation before the semiconductor memory device 100 performs a (K+1)th program loop.

Page buffer latches, which can be embodied as a conventional flip flop circuit, store a verification result in the Kth program loop, may be used for the read operation performed while the program operation is suspended. That is, for the read operation performed while the program operation is suspended, the verify result stored in the latches used for the read operation, may be erased, or deleted or otherwise removed. In order to resume the program operation, it is necessary to recover a verify result from the latches of the page buffer before the Kth program loop is performed. To this end, the semiconductor memory device 100 may first perform the pre-verify operation before the semiconductor memory device 100 performs the (K+1)th program loop.

After the pre-verify operation is performed, the semiconductor memory device 100 may perform the (K+1)th program loop.

Figure 6:
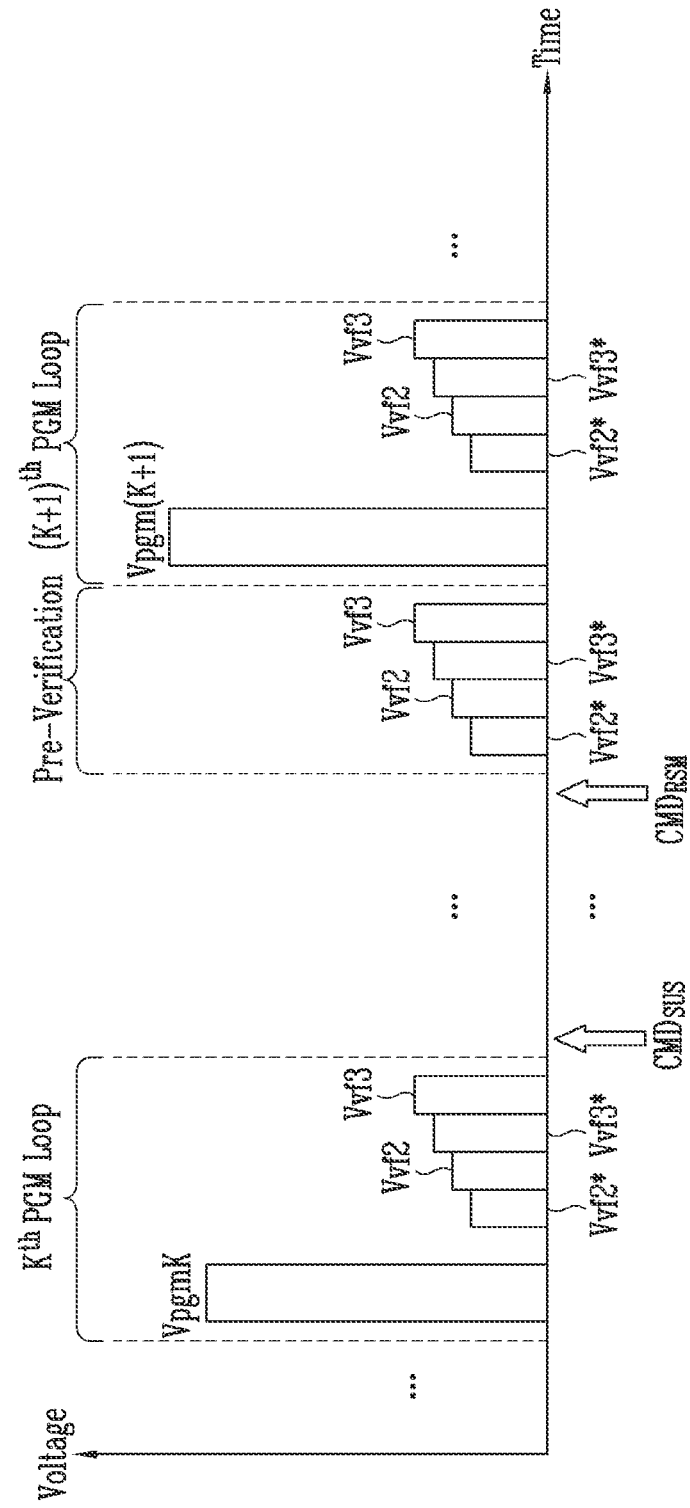
FIG. 6 is a diagram illustrating a voltage applied to a selected word line in suspending and resuming of the program operation.

FIG. 6 is a diagram illustrating a voltage applied to a selected word line, in suspending and resuming of the program operation. Hereinafter, a case where verification on the first program state PV1 passes and verification on the second and third program states PV2 and PV3 does not pass before the program suspend command is received will be mainly described.

Referring to FIG. 6, in the Kth program loop, a Kth program voltage VpgmK, the second auxiliary verify voltage Vvf2*, the second main verify voltage Vvf2, the third auxiliary verify voltage Vvf3*, and the third main verify voltage Vvf3 may be sequentially applied to the selected word line. In a pre-verify phase performed after the program operation is resumed, the second auxiliary verify voltage Vvf2*, the second main verify voltage Vvf2, the third auxiliary verify voltage Vvf3*, and the third main verify voltage Vvf3 may be sequentially applied to the selected word line. In the (K+1)th program loop, a (K+1)th program voltage Vpgm(K+1), the second auxiliary verify voltage Vvf2*, the second main verify voltage Vvf2, the third auxiliary verify voltage Vvf3*, and the third main verify voltage Vvf3 may be sequentially applied to the selected word line.

When the program operation is suspended after the Kth program loop is performed, a threshold voltage of selected memory cells may become low, according to a time at which the program operation is suspended due to a retention phenomenon. When the pre-verify phase and subsequent program loops are performed as shown in FIG. 6 in a state in which the threshold voltage of the selected memory cells becomes low, the threshold voltage distribution difference between memory cells is widened.

Figure 7A:
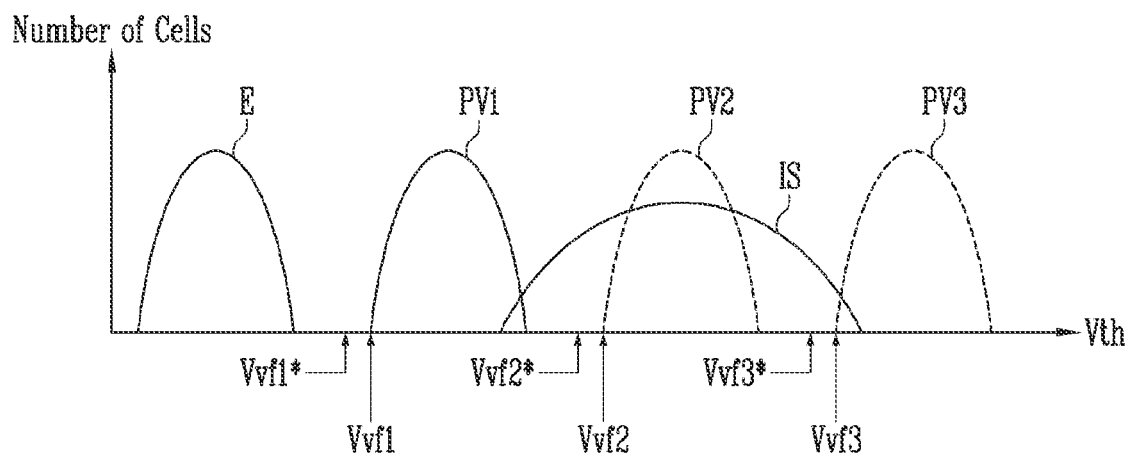
FIGS. 7A, 7B, and 7C are diagrams illustrating a threshold voltage distribution of memory cells when the program operation is suspended and then resumed.
Figure 7B:
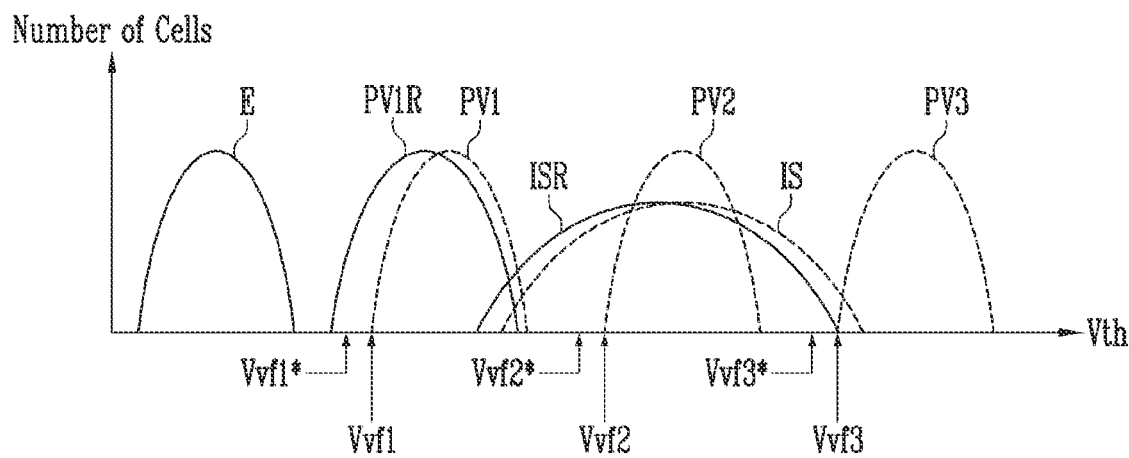
Figure 7C:
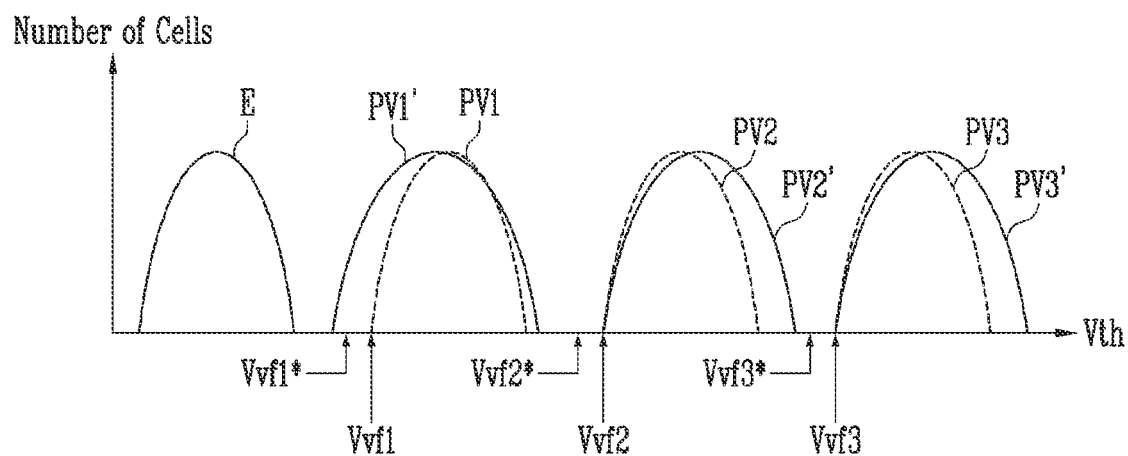

FIGS. 7A, 7B, and 7C are diagrams illustrating a threshold voltage distribution of memory cells when the program operation is suspended and then resumed.

Referring to FIG. 7A, a threshold voltage distribution of memory cells at a time at which the program operation is suspended by the program suspend command $CMD_{SUS}$ is illustrated. In the above-described example, it has been described that the verification on the first program state PV1 passes. That is, memory cells to be programmed to the first program state PV1 have all passed.

Meanwhile, memory cells to be programmed to the second and third program states PV2 and PV3 have not yet passed. Accordingly, a threshold voltage distribution of the memory cells to be programmed to the second and third program states PV2 and PV3 forms an intermediate state IS.

FIG. 7B illustrates a threshold voltage distribution of memory cells, which is changed as time elapses after the program operation is suspended. When time elapses after the program operation is suspended, the threshold voltage distribution of the memory cells is shifted to the left. A threshold voltage of memory cells in the erase state E is not shifted or has a relatively small shift width. Therefore, FIG. 7B, illustrates that the threshold voltage of the memory cells in the erase state E is not shifted.

Still referring to FIG. 7B, a threshold voltage distribution of memory cells which have been programmed to the first program state PV1 is changed to a first program state PV1R. In addition, the threshold voltage distribution of the memory cells included in the intermediate state IS, is changed to a shifted intermediate state ISR.

After that, when the program operation is resumed, the threshold voltage distribution width of memory cells may be widened as compared with when any program suspend-resume operation is not performed.

Specifically, when the program operation is resumed, a threshold voltage distribution using the second auxiliary verify voltage Vvf2*, the second main verify voltage Vvf2, the third auxiliary verify voltage Vvf3*, and the third main verify voltage Vvf3 is added to the intermediate state ISR shifted to the left. Accordingly, as shown in FIG. 7C, a threshold voltage distribution of memory cells to be programmed to the second program state PV2 becomes a degraded second program state PV2', and a threshold voltage distribution of memory cells to be programmed to the third program state PV3 becomes a degraded third program state PV3'.

Meanwhile, the threshold voltage distribution of the first program state PV1R shift to the left is influenced by the program operation of memory cells corresponding to the second and third program states PV2 and PV3 as the program operation is resumed. That is, by a subsequent program loop in which the threshold voltage of the memory cells corresponding to the second and third program states PV2 and PV3 increases, the threshold voltage distribution of the memory cells which have been programmed to the first program state PV1 is moved to the right, to form a degraded first program state PV1'.

Still referring to FIG. 7C, a distribution width of the degraded first to third program states PV1', PV2', and PV3' formed as the program suspend-resume operation is performed becomes wider than a distribution width of the first to third program states PV1, PV2, and PV3 formed when the program suspend-resume operation is not performed.

According to a semiconductor memory device and an operating method thereof in accordance with embodiments of the present disclosure, when the program operation is suspended and then resumed, the auxiliary verify voltage and the main verify voltage are modified and applied in the pre-verify phase. Accordingly, the threshold voltage distribution width of memory cells which have not yet verify-passed can be narrowed.

Figure 8:
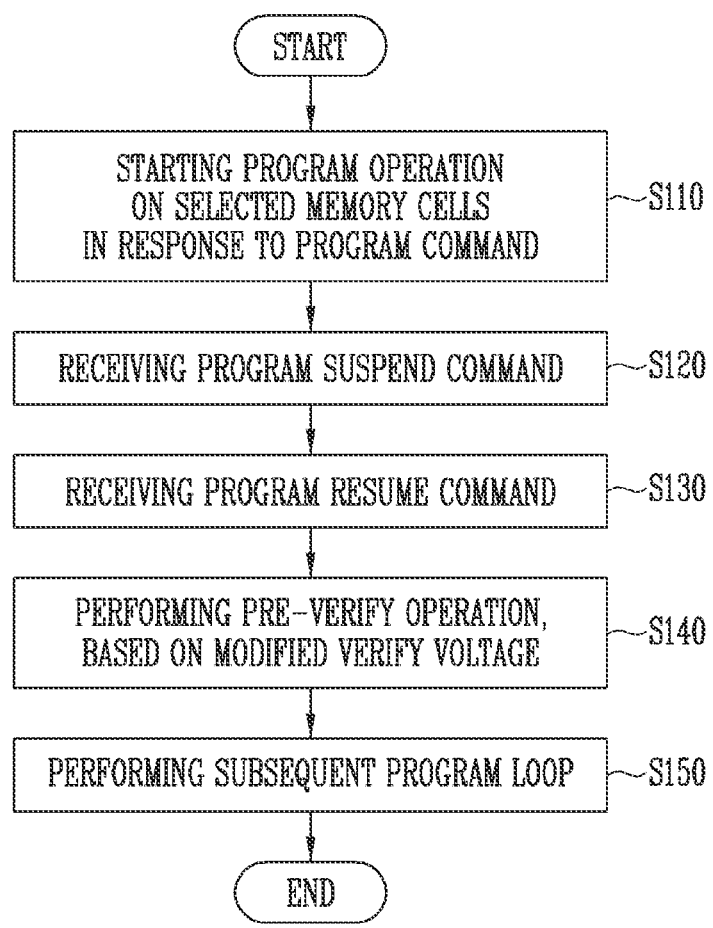
FIG. 8 is a flowchart illustrating an operating method of the semiconductor memory device in accordance with an embodiment of the present disclosure.

FIG. 8 is a flowchart illustrating an operating method of the semiconductor memory device in accordance with an embodiment of the present disclosure.

Referring to FIG. 8, the operating method of the semiconductor memory device in accordance with the embodiment of the present disclosure may include step S110 of starting a program operation on selected memory cells in response to a program command, step S120 of receiving a program suspend command, step S130 of receiving a program resume command, step S140 of performing a pre-verify operation, based on a modified verify voltage, and step S150 of performing a subsequent program loop.

Prior to step S110, the controller 200 may transfer a program command to the semiconductor memory device 100. In step S110, the semiconductor memory device 100 may start performance of a first program loop in response to the program command. After that, the semiconductor memory device 100 may repeatedly perform a plurality of program loops.

In step S120, the semiconductor memory device 100 may receive a program suspend command, and suspend a program operation in response to the program suspend command. After step S120, the semiconductor memory device 100 may perform various operations under the control of the controller 200. Accordingly, at least a portion of a verify result stored in the latches of the page buffer may be removed.

After an operation, e.g., a read operation according to the control of the controller 200 is performed, in step S130, the semiconductor memory device 100 may receive a program resume command from the controller 200.

After that, in step S140, the semiconductor memory device 100 may perform a pre-verify operation in response to the program resume command. A verify result may be stored in the page buffer latches by the pre-verify operation. According to the semiconductor memory device and the operating method thereof in accordance with the present disclosure, a verify voltage used for the pre-verify operation may be modified when the program operation is suspended and then resumed. That is, the pre-verify operation is performed using the verify voltage modified when the program operation is suspended and then resumed, so that the threshold voltage distribution of memory cells selected as a program target can be narrowed. Exemplary embodiments of the step S140 will be described later with reference to FIGS. 9 to 11.

After that, in step S150, a subsequent program loop may be performed. After the pre-verify operation is performed, subsequent program loops are performed, so that program operation is resumed. In an embodiment, a verify voltage used for the subsequent program loop of the step S150 may be an original verify voltage before being modified. That is, the verify voltage used for the subsequent program loop of the step S150 may be a verify voltage used before the program operation is suspended according to the reception of the program suspend command (S120).

Figure 9:
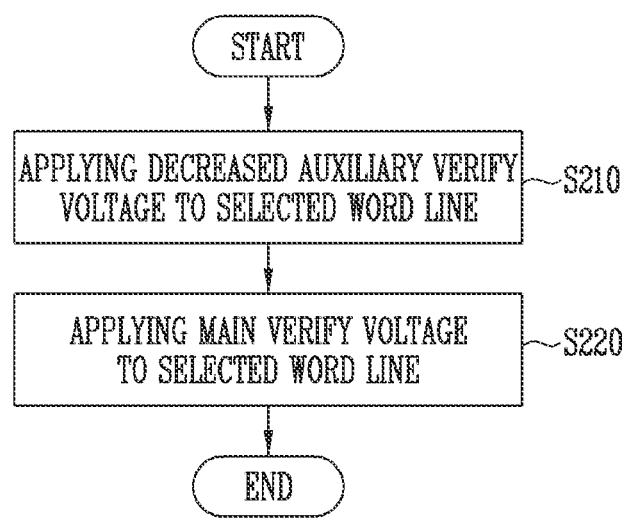
FIG. 9 is a flowchart illustrating an example of step S140 shown in FIG. 8.
Figure 10:
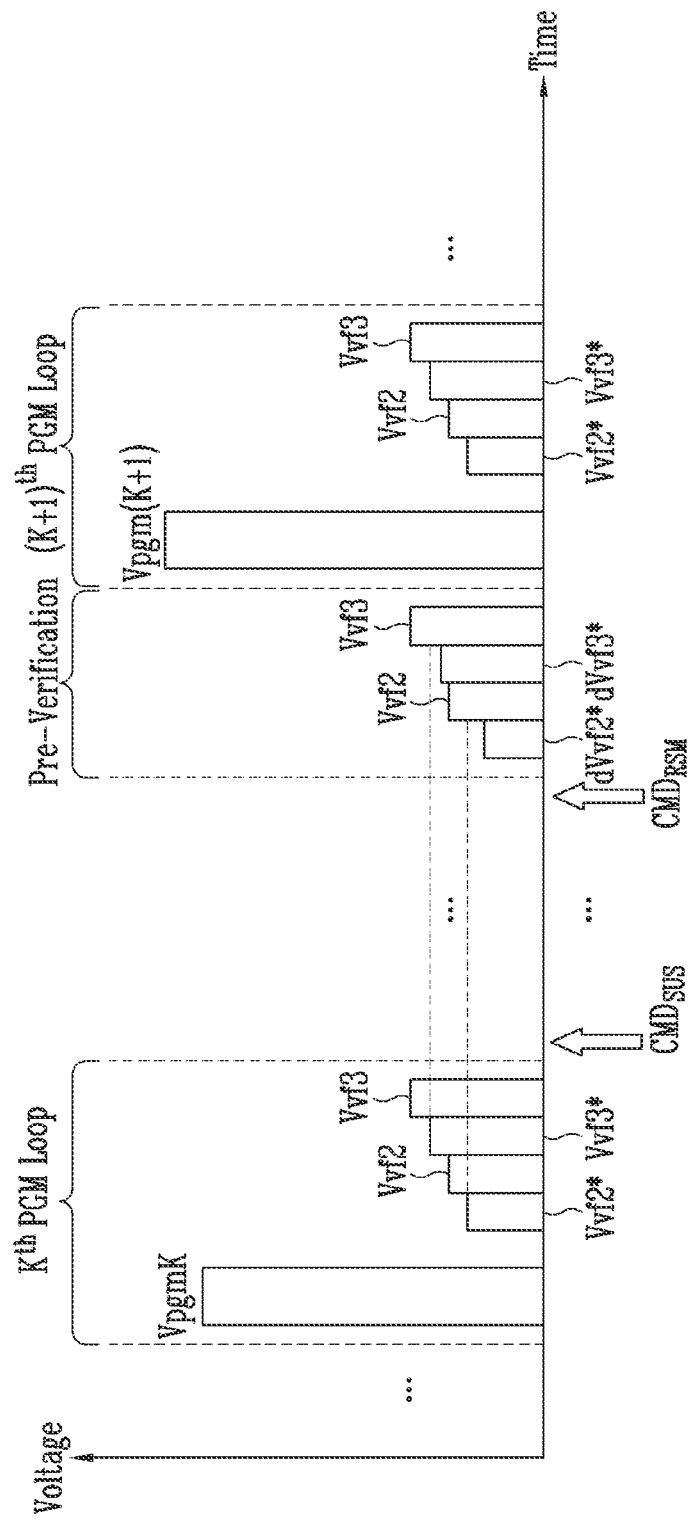
FIG. 10 is a diagram illustrating a voltage applied to a selected word line when the program operation is suspended and resumed according to the method shown in FIGS. 8 and 9.

FIG. 9 is a flowchart illustrating an example of the step S140 shown in FIG. 8. FIG. 10 is a diagram illustrating a voltage applied to a selected word line when the program operation is suspended and resumed according to the method shown in FIGS. 8 and 9. Hereinafter, an exemplary embodiment of step S140 will be described with reference to FIGS. 9 and 10 together.

Referring to FIG. 9, step S140 may include step S210, which comprises applying a decreased auxiliary verify voltage to a selected word line. In step S220, a main verify voltage is applied to the selected word line.

Referring now to FIG. 10, when the program resume command $CMD_{RSM}$ is received after the program suspend command $CMD_{SUS}$ is received, the semiconductor memory device 100 applies a reduced or decreased second auxiliary verify voltage dVvf2* to the selected word line and then the second main verify voltage Vvf2 is applied to the selected word line. The semiconductor memory device 100 also applies a decreased third auxiliary verify voltage dVvf3* to the selected word line and then applies the third main verify voltage Vvf3 to the selected word line.

Still referring to FIG. 10, the magnitude of the decreased second auxiliary verify voltage dVvf2* used for the pre-verify operation performed after the program resume command $CMD_{RSM}$ is received, is less than the magnitude of the second auxiliary verify voltage Vvf2* used for the Kth program loop. In addition, the magnitude of the decreased third auxiliary verify voltage dVvf3* used for the pre-verify operation performed after the program resume command $CMD_{RSM}$ is received, is less than the magnitude of the third auxiliary verify voltage Vvf3* used for the Kth program loop. The auxiliary verify voltages dVvf2* and dVvf3* having decreased magnitudes are used for the pre-verify operation, so that the threshold voltage distribution width of memory cells, which is formed as the program suspend-resume operation is performed, can be narrowed.

In an embodiment, the magnitudes of the auxiliary verify voltages used for the pre-verify operation may be determined based on a period in which the program operation is suspended. In an example, the period in which the program operation is suspended may be calculated based on a time at which the program suspend command is received and a time at which the program resume command is received. In another example, the period in which the program operation is suspended may be calculated based on a time at which a program loop lastly performed just before the program suspend command is received is completed and a time at which the pre-verify operation performed just after the program resume command is received is started. In accordance with an embodiment of the present disclosure, as the period in which the program operation is suspended becomes longer, the auxiliary verify voltages having smaller magnitudes may be used for the pre-verify operation.

Referring to FIGS. 9 and 10, it has been illustrated that, after the step S210 of applying the decreased auxiliary verify voltage to the selected word line is performed, the step S220 of applying the main verify voltage to the selected word line is performed. However, the present disclosure is not limited thereto. In accordance with an exemplary embodiment of the present disclosure, after the main verify voltage is applied to the selected word line, the decreased auxiliary verify voltage may be applied to the selected word line.

Figure 11:
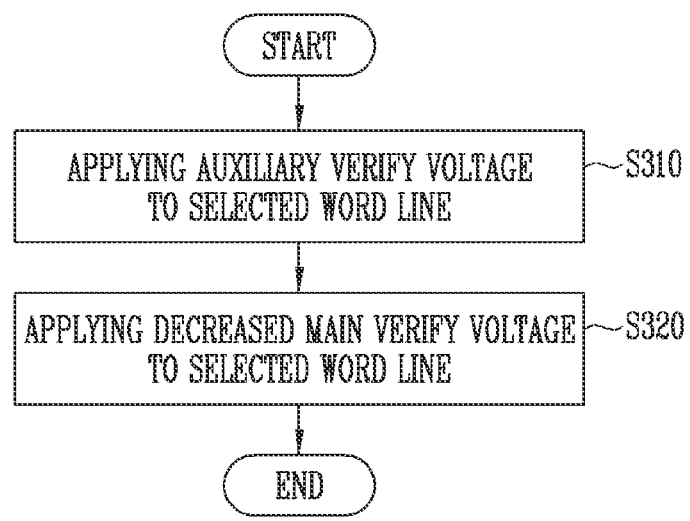
FIG. 11 is a flowchart illustrating another example of the step S140 shown in FIG. 8.
Figure 12:
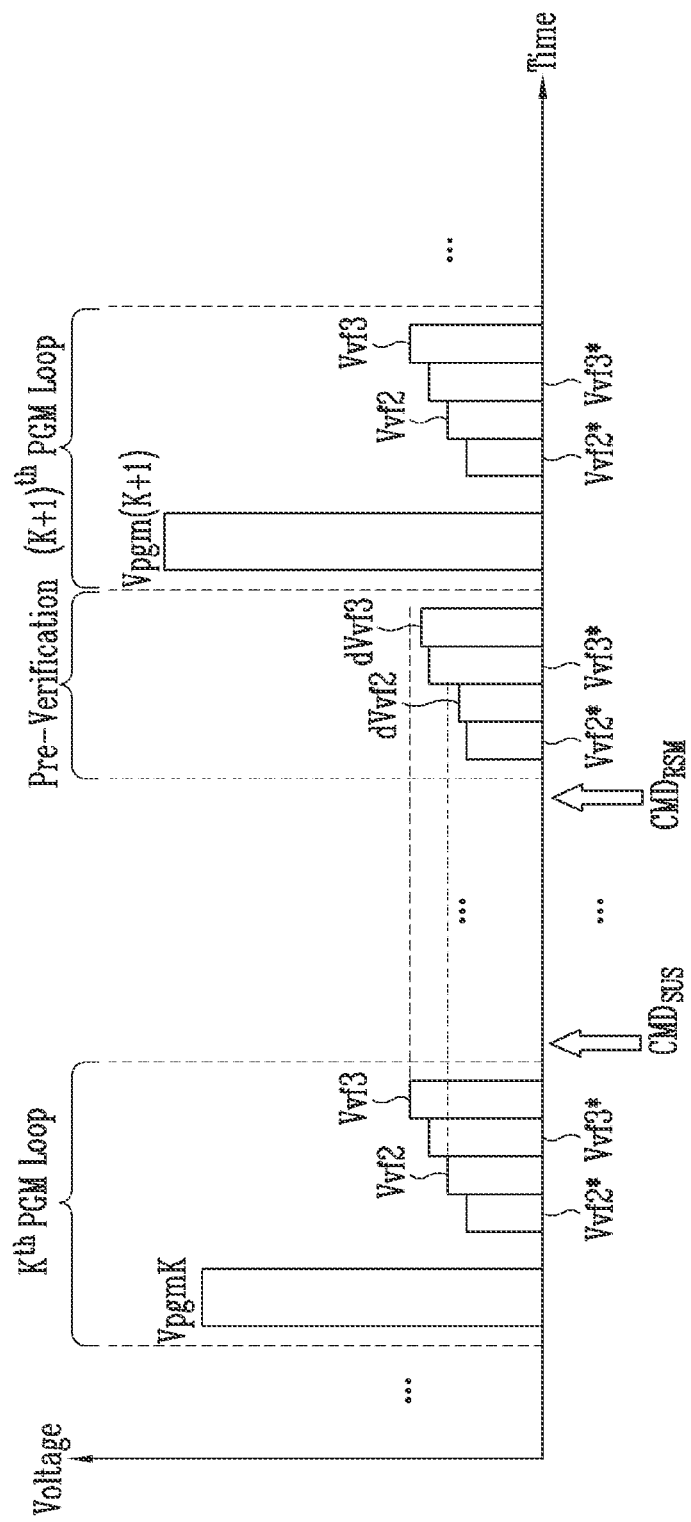
FIG. 12 is a diagram illustrating a voltage applied to a selected word line when the program operation is suspended and resumed according to the method shown in FIGS. 8 and 11.

FIG. 11 is a flowchart illustrating another example of the step S140 shown in FIG. 8. FIG. 12 is a diagram illustrating a voltage applied to a selected word line when the program operation is suspended and resumed according to the method shown in FIGS. 8 and 11. Hereinafter, an exemplary embodiment of the step S140 will be described with reference to FIGS. 11 and 12 together.

Referring to FIG. 11, step S140 may include step S310, which comprises applying an auxiliary verify voltage to a selected word line. Step S320 comprises applying a decreased main verify voltage to the selected word line.

Referring to FIG. 12, when the program resume command $CMD_{RSM}$ is received after the program suspend command $CMD_{SUS}$ is received, the semiconductor memory device 100 applies the second auxiliary verify voltage Vvf2* to the selected word line and then applies a decreased second main verify voltage dVvf2 to the selected word line. Also, the semiconductor memory device 100 applies the third auxiliary verify voltage Vvf3* to the selected word line and then applies a decreased third main verify voltage dVvf3 to the selected word line.

Still referring to FIG. 12, the magnitude of the decreased second main verify voltage dVvf2 used for the pre-verify operation performed after the program resume command $CMD_{RSM}$ is received is, less than the magnitude of the second main verify voltage Vvf2 used for the Kth program loop. The magnitude of the decreased third main verify voltage dVvf3 used for the pre-verify operation performed after the program resume command $CMD_{RSM}$ is received, is less than the magnitude of the third main verify voltage Vvf3 used for the Kth program loop. The main verify voltages dVvf2 and dVvf3 having the decreased magnitudes are used for the pre-verify operation, so that the threshold voltage distribution width of memory cells, which is formed as the program suspend-resume operation is performed, can be narrowed.

In an embodiment, the magnitudes of the main verify voltages used for the pre-verify operation may be determined based on a period in which the program operation is suspended. In an example, the period in which the program operation is suspended may be calculated based on a time at which the program suspend command is received and a time at which the program resume command is received. In another example, the period in which the program operation is suspended may be calculated based on a time at which a program loop lastly performed just before the program suspend command is received is completed and a time at which the pre-verify operation performed just after the program resume command is received is started. In accordance with an embodiment of the present disclosure, as the period in which the program operation is suspended becomes longer, the main verify voltages having smaller magnitudes may be used for the pre-verify operation.

FIGS. 11 and 12 illustrate that, after the step S310 of applying the auxiliary verify voltage to the selected word line is performed, the step S320 of applying the decreased main verify voltage to the selected word line is performed. However, the present disclosure is not limited thereto. In accordance with an exemplary embodiment of the present disclosure, after the decreased main verify voltage is applied to the selected word line, the auxiliary verify voltage may be applied to the selected word line.

Figure 13:
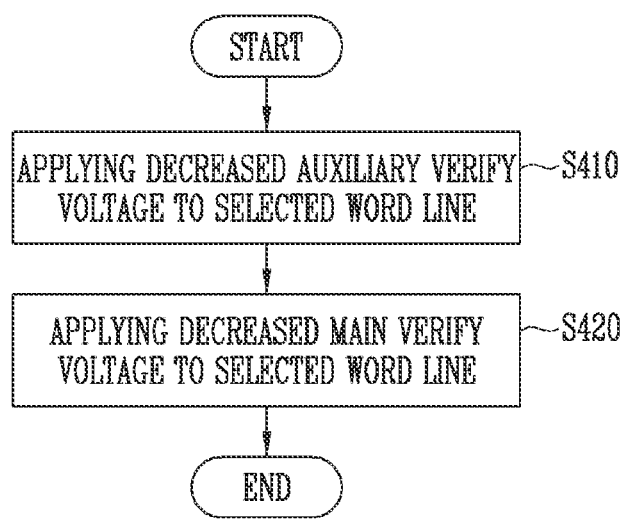
FIG. 13 is a flowchart illustrating still another example of the step S140 shown in FIG. 8.
Figure 14:
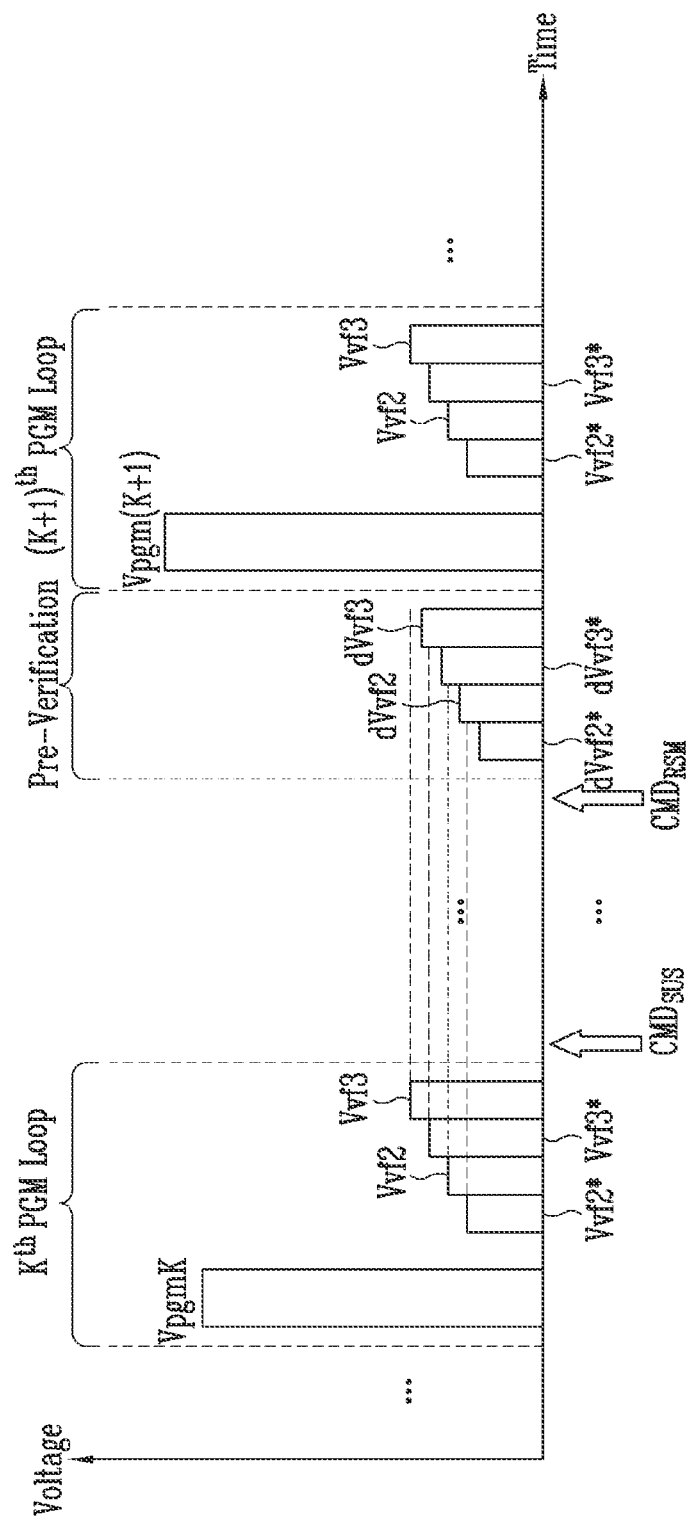
FIG. 14 is a diagram illustrating a voltage applied to a selected word line when the program operation is suspended and resumed according to the method shown in FIGS. 8 and 13.

FIG. 13 is a flowchart illustrating another example of step S140 shown in FIG. 8. FIG. 14 is a diagram illustrating a voltage applied to a selected word line when the program operation is suspended and resumed according to the method shown in FIGS. 8 and 13. Hereinafter, an exemplary embodiment of the step S140 depicted in FIGS. 13 and 14 will be described with reference to FIGS. 13 and 14.

Referring now to FIG. 13, the step S140 may include step S410, comprising the step of applying a decreased auxiliary verify voltage to a selected word line, and step S420, comprising the step of applying a decreased main verify voltage to the selected word line. Referring now to FIG. 14, when the program resume command $CMD_{RSM}$ is received after the program suspend command $CMD_{SUS}$ is received, the semiconductor memory device 100 applies a decreased second auxiliary verify voltage dVvf2* to the selected word line and then applies a decreased second main verify voltage dVvf2 to the selected word line. The semiconductor memory device 100 applies a decreased third auxiliary verify voltage dVvf3* to the selected word line and then applies a decreased third main verify voltage dVvf3 to the selected word line.

The auxiliary verify voltages dVvf2* and dVvf3* and the main verify voltages dVvf2 and dVvf3, which have the decreased magnitudes, are used for the pre-verify operation, so that the threshold voltage distribution width of memory cells, which is formed as the program suspend-resume operation is performed, can be narrowed.

In an embodiment, the magnitudes of the auxiliary verify voltages and the main verify voltages, which are used for the pre-verify operation, may be determined based on a period in which the program operation is suspended. In an example, the period in which the program operation is suspended may be calculated based on a time at which the program suspend command is received and a time at which the program resume command is received. In another example, the period in which the program operation is suspended may be calculated based on a time at which a program loop lastly performed just before the program suspend command is received is completed and a time at which the pre-verify operation performed just after the program resume command is received is started. In accordance with an embodiment of the present disclosure, as the period in which the program operation is suspended becomes longer, the auxiliary verify voltages having smaller magnitudes and the main verify voltages having smaller magnitudes may be used for the pre-verify operation.

Still referring to FIGS. 13 and 14, after step S410, which comprises applying the decreased auxiliary verify voltage to the selected word line, step S420 which comprises applying the decreased main verify voltage to the selected word line is performed. However, the present disclosure is not limited thereto. In accordance with an exemplary embodiment of the present disclosure, after the decreased main verify voltage is applied to the selected word line, the decreased auxiliary verify voltage may be applied to the selected word line.

Figure 15:
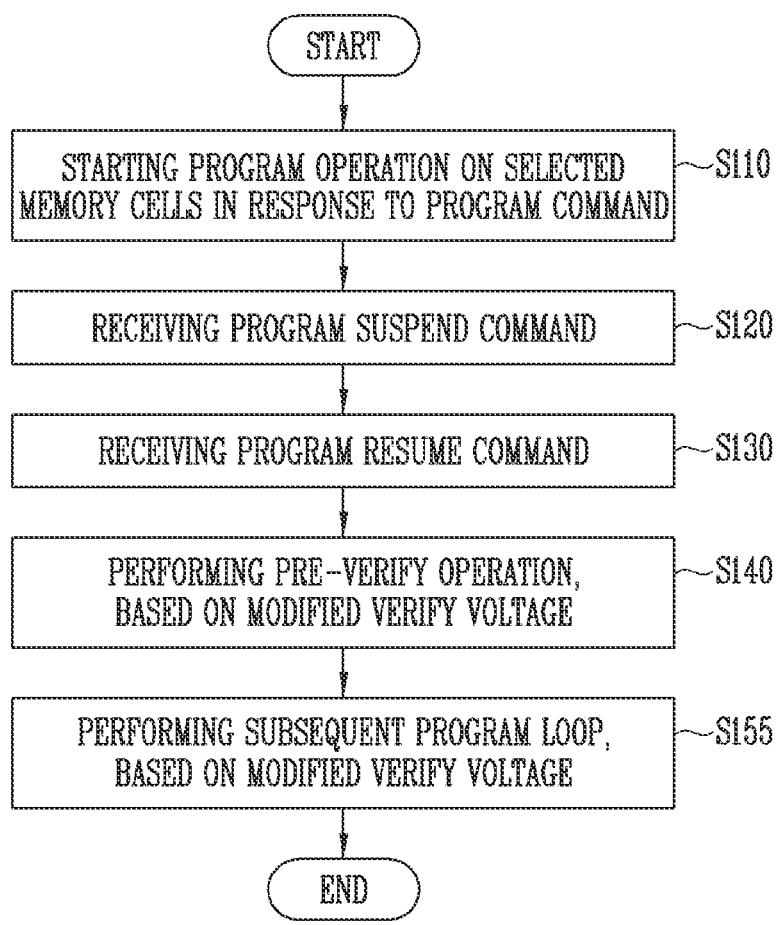
FIG. 15 is a flowchart illustrating an operating method of the semiconductor memory device in accordance with another embodiment of the present disclosure.

FIG. 15 is a flowchart illustrating an operating method of the semiconductor memory device in accordance with another embodiment of the present disclosure.

Referring to FIG. 15, the operating method of the semiconductor memory device in accordance with the another embodiment of the present disclosure may include step S110 wherein program operation on selected memory cells in response to a program command is started; step S120 which is to receive a program suspend command, step S130 is to receive a program resume command, step S140 which is to perform a pre-verify operation based on a modified verify voltage, and step S155 which is to perform a subsequent program loop, based on a modified verify voltage. The operating method of the semiconductor memory device shown in FIG. 15, is substantially identical to the operating method of the semiconductor memory device shown in FIG. 8 except for step S155. Therefore, in FIG. 15, overlapping descriptions of the steps S110, S120, S130, and S140 are hereinafter omitted in the interest of brevity.

In step S155, the semiconductor memory device 100 may perform a subsequent program loop, based on a modified verify voltage. In an embodiment, the modified verify voltage used for the subsequent program loop of the step S155 may be substantially identical to the modified verify voltage used for the pre-verify operation.

Figure 16:
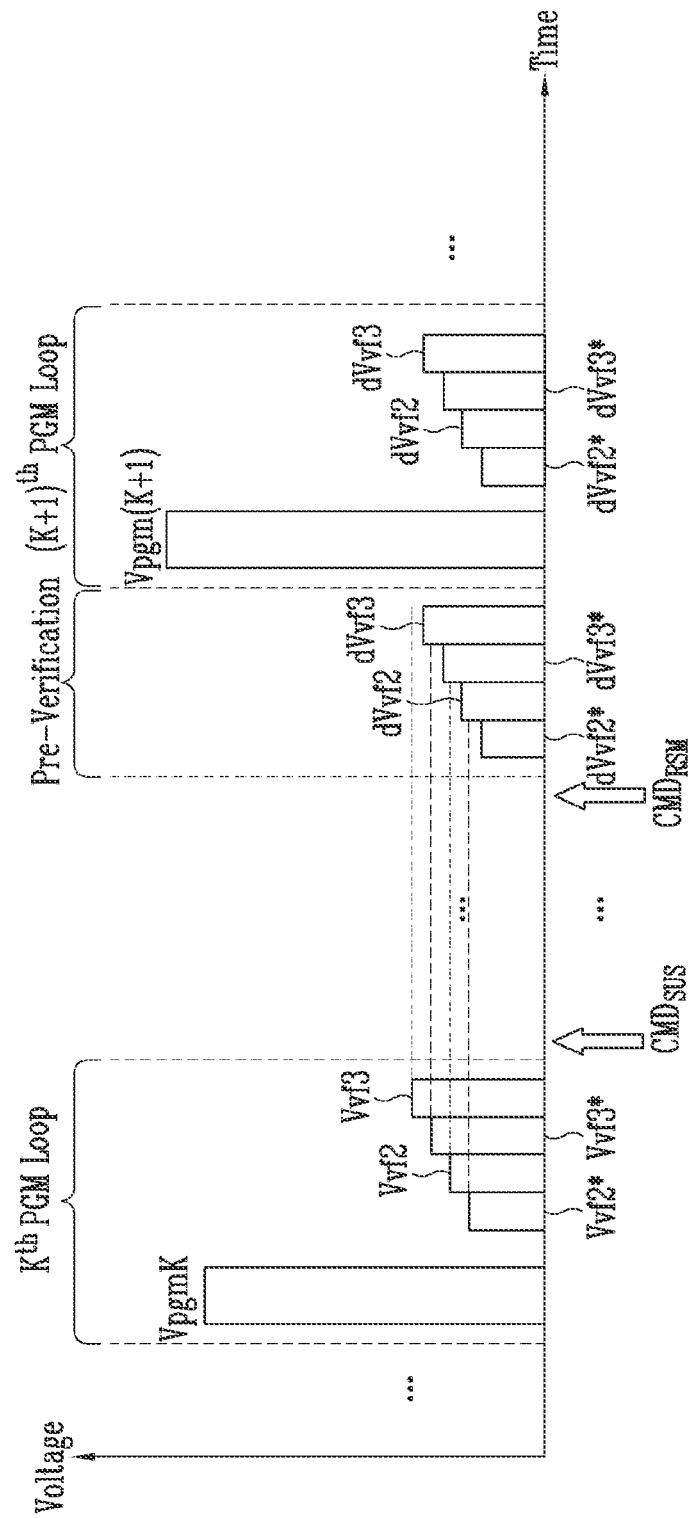
FIG. 16 is a diagram illustrating a voltage applied to a selected word line when the program operation is suspended and resumed according to the method shown in FIG. 15.

FIG. 16 is a diagram illustrating a voltage applied to a selected word line when the program operation is suspended and resumed according to the method shown in FIG. 15.

Referring to FIG. 16, the decreased auxiliary verify voltages dVvf2* and dVvf3* and the decreased main verify voltages dVvf2 and dVvf3 are used for the pre-verify operation. In addition, the decreased auxiliary verify voltages dVvf2* and dVvf3* and the decreased main verify voltages dVvf2 and dVvf3 are used for the verify phase of the (K+1)th program loop. The decreased auxiliary verify voltages dVvf2* and dVvf3* and the decreased main verify voltages dVvf2 and dVvf3 may be used for subsequent program loops. However, this is merely illustrative, and verify voltages before being decreased, may be used for the subsequent program loops as shown in FIGS. 10, 12, and 14. The decreased auxiliary verify voltages or the decreased main verify voltages may be used for only the pre-verify operation. Original auxiliary verify voltages may be used for the subsequent program loops before being decreased or original main verify voltages may be used for the pre-verify operation before being decreased.

Figure 17:
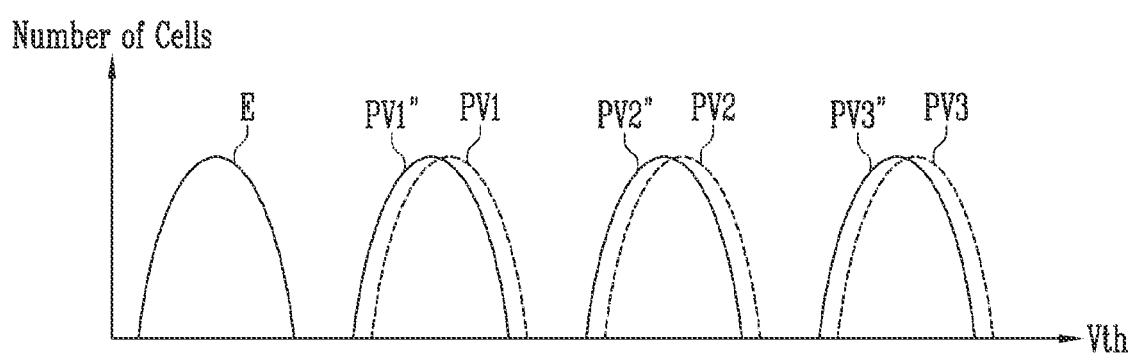
FIG. 17 is a diagram illustrating a threshold voltage distribution of memory cells, which is formed by an operating method of the semiconductor memory device in accordance with an embodiment of the present disclosure.

FIG. 17 is a diagram illustrating a threshold voltage distribution of memory cells, which is formed by an operating method of the semiconductor memory device in accordance with an embodiment of the present disclosure. In FIG. 17, threshold voltage distributions of first to third program states PV1, PV2, and PV3, which are formed when the program operation is not suspended and resumed is indicated by a dotted line, and threshold voltage distribution of first to third program states PV1", PV2", and PV3", which are formed when the program operation is suspended and resumed in accordance with the embodiment of the present disclosure are indicated by a solid line.

Referring to FIG. 17, when the pre-verify operation is performed using a decreased verify voltage when the program operation is resumed in accordance with the embodiment of the present disclosure even though the program operation is suspended and resumed, the threshold voltage distribution width of the first to third program states PV1", PV2", and PV3" may not be widened. Specifically, the first to third program states PV1", PV2", and PV3" formed when a decreased verify voltage is used for the pre-verify operation and a subsequent program loop after the program operation is resumed may be slightly shifted to the left, as compared with the first to third program states PV1, PV2, and PV3 formed when the program operation is not suspended. However, a threshold voltage distribution width of the first to third program states PV1", PV2", and PV3" formed when the decreased verify voltage is used for the pre-verify operation and the subsequent program loop after the program operation is resumed may be substantially equal to a threshold voltage width of the first to third program states PV1, PV2, and PV3 formed when the program operation is not suspended In accordance with the present disclosure, there can be provided a semiconductor device capable of narrowing a threshold voltage distribution of memory cells in a program operation, and an operating method of the semiconductor device.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, claimed method steps are not necessarily performed in accordance with the described order but may be rearranged. The embodiments disclosed in this specification and drawings are only examples, to facilitate an understanding of the present disclosure. The present disclosure should not be construed as being limited to embodiments described herein. It should be apparent to those skilled in the art, that various modifications can be made on the basis of the technological scope of the present disclosure.

The exemplars of the present disclosure have been described in the specification and depicted by corresponding drawings and specification. Although specific terminologies are used here, those are only to explain the embodiments of the present disclosure. The present disclosure is therefore not restricted to the above-described embodiments. Many variations of the disclosed embodiments are possible, within the spirit and scope of the present disclosure. It should therefore be apparent to those of ordinary skill in the art that various modifications can be made on the basis of the technological scope of the present disclosure in addition to the embodiments disclosed herein.

What is claimed is:

1. A method of operating a semiconductor device, the method comprising:
    starting a program operation on selected memory cells of a plurality of memory cells in response to a memory cell program command;
    suspending execution of the memory cell program command operation in response to a program suspend command; and
    performing a pre-verify operation by using a modified verify voltage in response to a program resume command.

2. The method of claim 1, wherein the program operation additionally comprises: running a plurality of program loops, and each program loop comprising a program phase and a verify phase,
    wherein the verify phase comprises applying a main verify voltage and an auxiliary verify voltage, which is less than the main verify voltage to a word line connected to the selected memory cells.

3. The method of claim 2, wherein performing of the pre-verify operation comprises:

applying a reduced auxiliary verify voltage to the word line; and applying the main verify voltage to the word line.

4. The method of claim 2, wherein performing the pre-verify operation comprises:

applying the auxiliary verify voltage to the word line; and applying a reduced main verify voltage to the word line.

5. The method of claim 2, wherein performing the pre-verify operation comprises:

applying a reduced auxiliary verify voltage to the word line; and applying a reduced main verify voltage to the word line.

6. A semiconductor device comprising:

a memory block comprising a plurality of memory cells; and a peripheral circuit configured to perform a program operation, which comprises a plurality of program loops on selected memory cells among a plurality of memory cells included in the memory block;

wherein the peripheral circuit comprises control logic, configured to:

control the program operation of the peripheral circuit;

control the peripheral circuit to suspend the program operation in response to a program suspend command; and control the peripheral circuit to perform a pre-verify operation on the selected memory cells, based a modified verify voltage, in response to a program resume command.

7. The semiconductor device of claim 6, wherein each of the plurality of program loops performed by the peripheral circuit includes a program phase and a verify phase, and, in the verify phase, the control logic causes the peripheral circuit to perform a verify operation using a main verify voltage and an auxiliary verify voltage less than the main verify voltage.

8. The semiconductor device of claim 7, wherein, during the pre-verify operation, the control logic controls the peripheral circuit to perform a verify operation using the main verify voltage and a decreased auxiliary verify voltage.

9. The semiconductor device of claim 7, wherein, during the pre-verify operation, the control logic controls the peripheral circuit to perform a verify operation using a decreased main verify voltage and the auxiliary verify voltage.

10. The semiconductor device of claim 7, wherein, during the pre-verify operation, the control logic controls the peripheral circuit to perform a verify operation using a decreased main verify voltage and a decreased auxiliary verify voltage.

11. The semiconductor device of claim 6, wherein the control logic is configured to determine a magnitude of the modified verify voltage, based on a period in which the program operation is suspended.

12. The semiconductor device of claim 6, wherein, after the pre-verify operation, the control logic controls the peripheral circuit to perform a subsequent program loop.

13. The semiconductor device of claim 12, wherein the control logic is configured to control the peripheral circuit to perform a verify phase of the subsequent program loop, based on an original verify voltage before being modified.

14. A semiconductor device comprising:

a memory block comprising a plurality of memory cells, each of which storing N-bit data; and a peripheral circuit configured to perform a program operation, which includes performing a plurality of program loops on selected memory cells among the plurality of memory cells included in the memory block;

wherein the peripheral circuit comprises control logic configured to control the program operation of the peripheral circuit in response to a program command, and control the peripheral circuit to suspend the program operation in response to a program suspend command received after verification of memory cells to be programmed to an ith program state among first to $(2^N-1)$th program states passes, and control the peripheral circuit to perform a pre-verify operation on memory cells to be programmed to a jth program state among (i+1)th to $(2^N-1)$th program states, based on a modified verify voltage, in response to a program resume command, wherein N is a natural number greater than 1, i is a natural number which is greater than 0 and is smaller than $(2^N-1)$, and j is a natural number which is greater than i and is smaller than $2^N$.

15. The semiconductor device of claim 14, wherein each of the plurality of program loops comprises a program phase and a verify phase, and, in the verify phase, the control logic controls the peripheral circuit to perform a verify operation on the memory cells to be programmed to the jth program state by using a main verify voltage and an auxiliary verify voltage, which correspond to the jth program state.

16. The semiconductor device of claim 15, wherein, in the pre-verify operation, the control logic controls the peripheral circuit to perform a verify operation on the memory cells to be programmed to the jth program state by using the main verify voltage and a decreased auxiliary verify voltage.

17. The semiconductor device of claim 16, wherein, after the pre-verify operation, the control logic controls the peripheral circuit to perform a subsequent program loop by using the main verify voltage and an original auxiliary verify voltage before being decreased.

18. The semiconductor device of claim 15, wherein, in the pre-verify operation, the control logic controls the peripheral circuit to perform a verify operation on the memory cells to be programmed to the jth program state by using a decreased main verify voltage and the auxiliary verify voltage.

19. The semiconductor device of claim 18, wherein, after the pre-verify operation, the control logic controls the peripheral circuit to perform a subsequent program loop by using the decreased main verify voltage and the auxiliary verify voltage.

20. The semiconductor device of claim 15, wherein, in the pre-verify operation, the control logic controls the peripheral circuit to perform a verify operation on the memory cells to be programmed to the jth program state by using a decreased main verify voltage and a decrease auxiliary verify voltage.

21. The semiconductor device of claim 20, wherein, after the pre-verify operation, the control logic controls the peripheral circuit to perform a subsequent program loop by using an original main verify voltage before being decreased and an original auxiliary verify voltage before being decreased.

22. The semiconductor device of claim 15, wherein the control logic determines a magnitude of the modified verify voltage, based on a period in which the program operation is suspended.

* * * * *